(12) United States Patent
Hekstra et al.

(10) Patent No.: US 7,849,377 B2
(45) Date of Patent: Dec. 7, 2010

(54) SISO DECODER WITH SUB-BLOCK PROCESSING AND SUB-BLOCK BASED STOPPING CRITERION

(75) Inventors: Andries Pieter Hekstra, Eindhoven (NL); Johannus Theodorus Matheus Hubertus Dielissen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1203 days.

(21) Appl. No.: 10/596,543

(22) PCT Filed: Dec. 8, 2004

(86) PCT No.: PCT/IB2004/052709

§ 371 (c)(1),
(2), (4) Date: Jun. 16, 2006

(87) PCT Pub. No.: WO2005/064800

PCT Pub. Date: Jul. 14, 2005

(65) Prior Publication Data

US 2009/0019332 A1    Jan. 15, 2009

(30) Foreign Application Priority Data

Dec. 22, 2003    (EP) .................................. 03104923

(51) Int. Cl.
*H03M 13/00* (2006.01)
(52) U.S. Cl. ........................ 714/752; 714/774
(58) Field of Classification Search .............. 714/752, 714/774
See application file for complete search history.

(56) References Cited

U.S. PATENT DOCUMENTS

| | | | | |
|---|---|---|---|---|
| 5,996,104 A * | 11/1999 | Herzberg | ................... | 714/755 |
| 6,732,321 B2 * | 5/2004 | Classon et al. | ............. | 714/774 |
| 6,829,313 B1 * | 12/2004 | Xu | ............... | 714/795 |
| 6,871,303 B2 * | 3/2005 | Halter | ......................... | 714/702 |
| 6,901,117 B1 * | 5/2005 | Classon et al. | ............. | 375/341 |
| 7,092,464 B2 * | 8/2006 | Mills | ......................... | 375/346 |
| 2001/0044919 A1 * | 11/2001 | Edmonston et al. | ......... | 714/752 |
| 2002/0099985 A1 * | 7/2002 | Cheng | ......................... | 714/704 |
| 2004/0148556 A1 * | 7/2004 | Hagh et al. | ................. | 714/755 |
| 2004/0199848 A1 * | 10/2004 | Tamesue et al. | ............. | 714/758 |
| 2004/0223480 A1 * | 11/2004 | Nguyen et al. | ............. | 370/342 |
| 2004/0234007 A1 * | 11/2004 | Mills | ......................... | 375/340 |
| 2005/0111564 A1 * | 5/2005 | Kramer et al. | ............. | 375/265 |

* cited by examiner

*Primary Examiner*—M. Mujtaba K Chaudry
(74) *Attorney, Agent, or Firm*—Larry Liberchuk

(57) ABSTRACT

The present invention relates to SISO decoder for iteratively decoding a block of received information symbols (r), in particular for use in a turbo decoder, said block being divided into a number of windows of information symbols. In order to achieve a significant reduction of power consumption a SISO decoder is proposed comprising at least one SISO decoding unit (17, 21) for SISO decoding of the received information symbols (r) of a window, wherein a stopping criterion is applied to each window. This allows to abort iterative decoding for each window individually once convergence of decoding is determined by marking a window or sub-block inactive (17,23). An inactive window is no longer SISO decoded in subsequent iterations.

11 Claims, 4 Drawing Sheets

SISO DECODER WITH SUB-BLOCK PROCESSING AND SUB-BLOCK BASED STOPPING CRITERION

The present invention relates to SISO decoder for iteratively decoding a block of received information symbols, in particular for use in a turbo decoder, said block being divided into a number of windows of information symbols. The invention relates further to a turbo decoder using such SISO decoders and to corresponding decoding methods. Finally, the invention relates to a computer program for implementing said methods.

Turbo codes are powerful error correcting block codes that are included in e.g. the UMTS standard. The amount of signal processing required for UMTS signal reception by far exceeds that for GSM and is a drain to the battery of an UMTS handset. The decoding of turbo encoded signals ("turbo decoding") is a computationally very intensive process. A well-known way to limit the computational load and hence the current consumption of the iterative turbo decoding process is to use stopping criteria to reduce the average number of iterations. These known stopping criteria apply to an entire block of data in the turbo decoder, which shall be called global stopping criteria.

Shortly after the discovery of turbo codes, it was discovered that the turbo decoder principles could be applied to equalization. Equalization is a well-known discipline in signal processing which aims at annihilating the effects of inter symbol interference. This is then called turbo equalization. The difference between turbo coding and turbo equalization is that in the case of turbo equalization at least one binary modulo 2 convolutional encoder (a digital filter) in what previously was the turbo encoder must be replaced by an analog filter. It is well known that there is no fundamental difference between turbo decoding when applied to the decoding of turbo codes and turbo decoding applied to the serial concatenation of e.g. a convolutional encoder (an interleaver) and an intersymbol interference channel. Hence, with the term "turbo decoding" used in the following reference is made to both of these applications of the same fundamental technique.

B. Frey, F. Kschischang, "Early Detection and Trellis Splicing: Reduced Complexity Iterative Decoding," IEEE Journal on Selected Areas in Communications, Vol. 16, No. 2, pp. 153-159, February 1998. discloses a method called "early detection," in which bits in the trellis or segments of the trellis that have become certain, are no longer processed. This method has the advantage of further reducing the computational load of turbo decoding, which can save battery current, or reduce decoding latency. Also known are a few varieties of window based Soft Input Soft Output (SISO) modules for use in turbo decoders. The motivation for using windows, then, is to reduce the memory requirement and possibly to reduce decoding latency.

Binary turbo codes are the most common. An often used soft-decision bit representation in turbo decoders is log-likelihood ratios. For binary codes, the sign of a log-likelihood ratio (LLR) indicates the corresponding hard-decision bit value and the absolute value of a log-likelihood ratio is indicative of the reliability (certitude) of the estimation. However, generalization to the non-binary case is possible. In that case, the reliability of the log-likelihood (ratio) vector is e.g. determined by the difference between the largest and one-but-largest component. In the following, the description focuses on the binary case; however, the general case shall not be excluded thereby.

During the iterations of a turbo decoder, typically the log-likelihood ratios increase in absolute value, with some random fluctuations and sometimes a change of sign. In a practical implementation, the dynamic range of the log-likelihood ratios must be limited to some finite fixed point or integer range. Clipping of intermediate results is used to keep the variables inside this range. Empirically, once the log-likelihood ratio variable of a certain message bit has been clipped, it will mostly stay stuck at this level during all future iterations. Effectively, this means that the bit has become non-random, or deterministic. In the above mentioned publication of Frey and Kschischang such per-bit detection prior to the final iteration is disclosed (called "early detection."), and also uses the more general term "segment of a trellis," indicating that a number of adjacent message bits could be early-decided simultaneously. Such decided bits are then removed from the trellis.

The most extreme variation of a SISO module that limits the memory requirement for storage of the metrics and/or limits the decoding latency is disclosed in WO 00/59118. According to this document, many sliding windows are processed in parallel by separate SISO worker units. This applies both to sliding window decoders with training intervals, and sliding window decoders with next iteration initialization.

In (Max)(Log)MAP SISO modules, in principle a trellis with a length equal to the number of message bits in a message block must be processed both in the forward and in the backward trellis direction. Path metrics, sometimes also called state metrics, are computed for the forward and backward direction of trellis processing. The output log-likelihood ratios (a posteriori or extrinsic) are a function of the path metrics in both trellis directions. This requires the storage of the path metrics in at least one trellis direction, usually called the backward trellis direction. In UMTS the trellis has 8 states in each trellis section, and the trellis can have a length of 5114 message bits (thus, 5114 trellis sections). To store path metrics for all states for all sections on a chip would cost a prohibitive amount of memory. This is one reason why window techniques are introduced in (Max)(Log)MAP SISO modules. They work out such that, e.g. the path metrics for the backward trellis direction only need to be stored for one window length (per processor unit). This window length can be a small fraction of the entire message block length, realizing large memory savings.

A further motivation for using windows in SISO modules is that they allow separate windows to be processed independently by different processing units. Thus, the processing speed and throughput can be increased. Generally, the reduction of the decoding latency is emphasized.

It is thus an object of the present invention to provide a SISO decoder, in particular for use in a turbo decoder, by which a significant reduction of power consumption can be achieved.

This object is achieved according to the present invention by a SISO decoder as claimed in claim 1 which comprises:

at least one SISO decoding unit for SISO decoding of the received information symbols of a window, a window activity flag storage for storing window activity flags indicating if a window is made active or inactive, a window activity flag setting unit for setting said window activity flag active or inactive, wherein said window activity flags are initially set active and wherein a window activity flag of a window is set inactive if a certitude indication value of the information symbols in said window are above a predetermined certitude threshold, a window activity flag reading unit for reading said window activity flags from said window activity flag storage, and a control unit for controlling said at least one SISO decoding unit based on the read window activity flags such that the information symbols of a window for which the corresponding window activity flag is set inactive are not SISO decoded in subsequent iterations.

The present invention is based on the idea to apply early-detection such that only entire sliding windows may be early-detected. This means that the window based SISO decoder can skip entire windows. In an implementation this is especially simple to realize. Further, each sliding window in a SISO decoder has a window activity flag. Initially, all sliding windows are active. When a certitude indication value of the information symbols in said window, which could, in for instance and as proposed in a preferred embodiment, be all a posteriori log-likelihood ratios, has reached an absolute clipping level (certitude threshold), which is a predetermined value, i.e. when all message bits in the window have reached a certain degree of certitude, the activity flag of that window is set to inactive, and the window is skipped during future iterations of decoding the given information block.

According to the solution described by Frey and Kschischang, when bits have become certain, the probability of the bit being 0 is set to zero or one and where it is removed from the trellis. Instead, in order to avoid any reorganization cost of removing it from the trellis, according to a preferred aspect of the present invention the probability (certitude indication value) is frozen to its last computed value, which will be close to zero or one, but not equal to it. When, as proposed in a preferred embodiment, log-likelihood ratios are used, setting probabilities equal to zero or one as proposed by Frey and Kschischang would give rise to log-likelihood ratios of plus or minus infinity, which is not practical.

The present invention also relates to a turbo decoder as claimed in claim 8 for iteratively decoding received information symbols, in particular channel symbols of a channel data stream, comprising two SISO decoder as claimed in claim 1 for SISO decoding of said received information symbols, said SISO decoders being arranged in row, each having as inputs the received information symbols and a priori information probabilities of the information symbols generated as output by the respective other SISO decoder.

A SISO decoding method and a turbo decoding method according to the invention are defined in claims 9 and 10. A computer program according to the invention for implementing said methods on a computer is defined in claim 11. Preferred embodiments of the invention are defined in the dependent claims.

According to a preferred embodiment the certitude indication value is the absolute value of the log-likelihood ratios (LLR) of the information symbols. A window activity flag of a window is then set inactive if the absolute values of the log-likelihood ratios of the information symbols in said window are above a predetermined log-likelihood threshold.

It is possible either to store the extrinsic LLR values or the a posteriori LLR values. In a preferred implementation the a posteriori LLRs are used to detect that the bits in a window are certain, and then SISO processing of that window stopped from then on, which then means that the extrinsic LLRs which were then produced are kept frozen. Two versions of the result are possible. The difference between these two versions is that the detection whether a window is certain or not is either done on either the produced (output) extrinsic LLRs or on the a posteriori LLRs. The relation between these two LLRs is a mere addition or subtraction, i.e.

output extrinsic LLR=a posteriori LLR−a priori LLR, where the a priori LLR is the output extrinsic of the previous sub-iteration. Preferably, the detection whether a window can be frozen or not is done on the a posteriori LLRs and not on the extrinsic LLRs since the a posteriori LLRs capture more information about a message bit and hence can more reliably indicate whether an information bit has become certain.

According to further embodiments it is proposed to store the extrinsic LLRs and pass them on to next SISO decoder or to store the a posteriori LLRs and pass them on to next SISO decoder. The original turbo codes are now called Parallel Concatenated Convolutional Codes (PCCC). However, later also Serial Concatenated Convolutional Codes (SCCC) were developed and work well. E.g. the turbo equalization mentioned above corresponds to SCCCs. Now, in an implementation, most logical would be to store the input to the SISO decoder (in permuted or direct order), viz. the extrinsic LLRs.

According to a further embodiment the SISO decoding unit comprises:

a forward processing unit for computing forward state metrics ($\alpha$), a backward processing unit for computing backward state metrics ($\beta$), metrics storage means for storing forward and backward state metrics ($\alpha$, $\beta$), output means for outputting forward and/or backward state metrics ($\alpha$, $\beta$), and input means for receiving forward state metrics from a SISO decoding unit that decodes channels symbols of a window being located in front of the currently processed window and for receiving backward state metrics from a SISO decoding unit that decodes channels symbols of a window being located behind the currently processed window.

According to a preferred embodiment said metrics storage means are adapted for storage of the starting state metrics for forward and/or backward calculations ($\alpha$, $\beta$) of a window. In particular, the a posteriori or extrinsic output log-likelihood ratios of inactive windows are frozen. That is, the outputs of the last time these windows were active and were SISO-processed are stored and used over and over again. They are kept "as is" (i.e. not updated) in the pertaining memory.

The stopping rule described above, i.e. perform the iteration until all windows of an information block have been made inactive, reduces the workload the more the higher the Eb/No, i.e. the ratio of energy per information symbol (Eb) to noise spectral density (No). An easy variation of the above stopping rule can also limit the workload when the Eb/No is so low that successful decoding is (almost) impossible. At low SNR, it can be checked whether after a minimum number of iterations (e.g. 3 or 3.5) there is at least one window that has been made inactive, i.e. all a posteriori log-likelihood ratios in that window (permuted or in direct order) have been clipped. Then, if no window has been made inactive, the decoding procedure is aborted.

Double sets of activity flags per window can be implemented, where a first criterion to decide about setting a first window flag to inactive so that the window would no longer be SISO processed, differs from a second criterion that is used to decide whether a second window activity flag of the same window is to be set to inactive. Then, the decoding procedure is aborted when, after a minimum number of iterations no second window activity flag is set to inactive. In a preferred embodiment these criteria are the same and a single window activity flag per sliding window (per SISO unit) is implemented.

Regardless, of whether (sliding) window based processing is employed in the SISO modules, when describing above e.g. 3.5 iterations, it is assumed that the turbo decoder uses two SISO modules in a serial fashion as is the most common in the art. That is, at any time only one SISO module is active. However, the invention also applies when two or more SISO modules are operated in parallel. In that case, at the same time, two or more SISO modules can be active. Throughout the following text, it is assumed that two SISO modules are operating in a serial fashion. In order to distinguish the first SISO module in an iteration from the second, the terms "sub-iteration", in particular "odd sub-iteration" and "even sub-iteration" are used. Whenever, in the sequel the word "odd" or "even" is encountered, e.g. in the figures, it refers to the number of sub-iterations.

Combination of the above described methods means that for each active window it is monitored whether is should be stopped as all absolute values of all a posteriori (or extrinsic) LLRs exceed a given threshold. As windows become inactive, there are immediate advantages to the computational load. When a given predetermined iteration index (3 or 3.5) is reached, it is checked whether at least one window is inactive. If not, the entire decoding is aborted. This way, the combination of the high SNR and low SNR rules does not involve any switching between these two rules. These rules are simply applied jointly according to a preferred embodiment.

According to other embodiments either a plurality of SISO decoding units for parallel SISO decoding of the information symbols of a plurality of windows or a single SISO decoding unit for serial SISO decoding of the information symbols of a plurality of windows can be provided.

The present invention of a new SISO decoder applies preferably to a turbo decoder, which generally has at least two SISO decoders. Therefore, in a turbo decoder, each information bit occurs in at least two blocks, typically one in direct order and one (or more) in a permuted order. Each block is divided in separate windows, so an information bit is in at least two windows. Thus, an information bit can be frozen or inactive in one window and active in another window.

Further variations of the present invention are possible. In one variation the absolute threshold level at which the decision to clip an a posteriori log-likelihood ratio is taken depends on the iteration index. Also the clipping level may be larger than the threshold level at which a clipping decision is taken. Similarly, the clipping level may be iteration dependent, e.g. increase with successive iterations. Both the threshold and the clipping level may also depend on the (half) iteration at which a window was first clipped.

Instead of basing clipping decisions on a posteriori log-likelihood ratios, they may be based on extrinsic output log-likelihood ratios.

The present invention does not cost additional memory. In an preferred embodiment, considering next initialization iteration, one set of stakes comprising (initialization values for the backward path metrics for all states in the trellis section in the rightmost (most "forward") trellis section in a window are stored. Once a window becomes inactive, such initialization vectors for the backward trellis recursion of that window are no longer needed. However, during the next iteration, the forward trellis recursion of (Max)(Log)MAP for the window to the right of it (more "forward") does need an initialization vector. The storage space which was no longer needed for the backward initialization vectors (stakes) of the inactive window, can now be reused for the storage of the forward initialization vectors (stakes) for the window to the right of it (more "forward" window). Thus, the total memory consumption for the stakes remains unaffected by the application of early detection of windows. The space per window to remember whether it is still active or not, i.e. the window activity flag storage, which can be a simple one bit storage per window, is negligible.

The present invention will now be explained in more detail with reference to the drawings in which.

Figure 1:
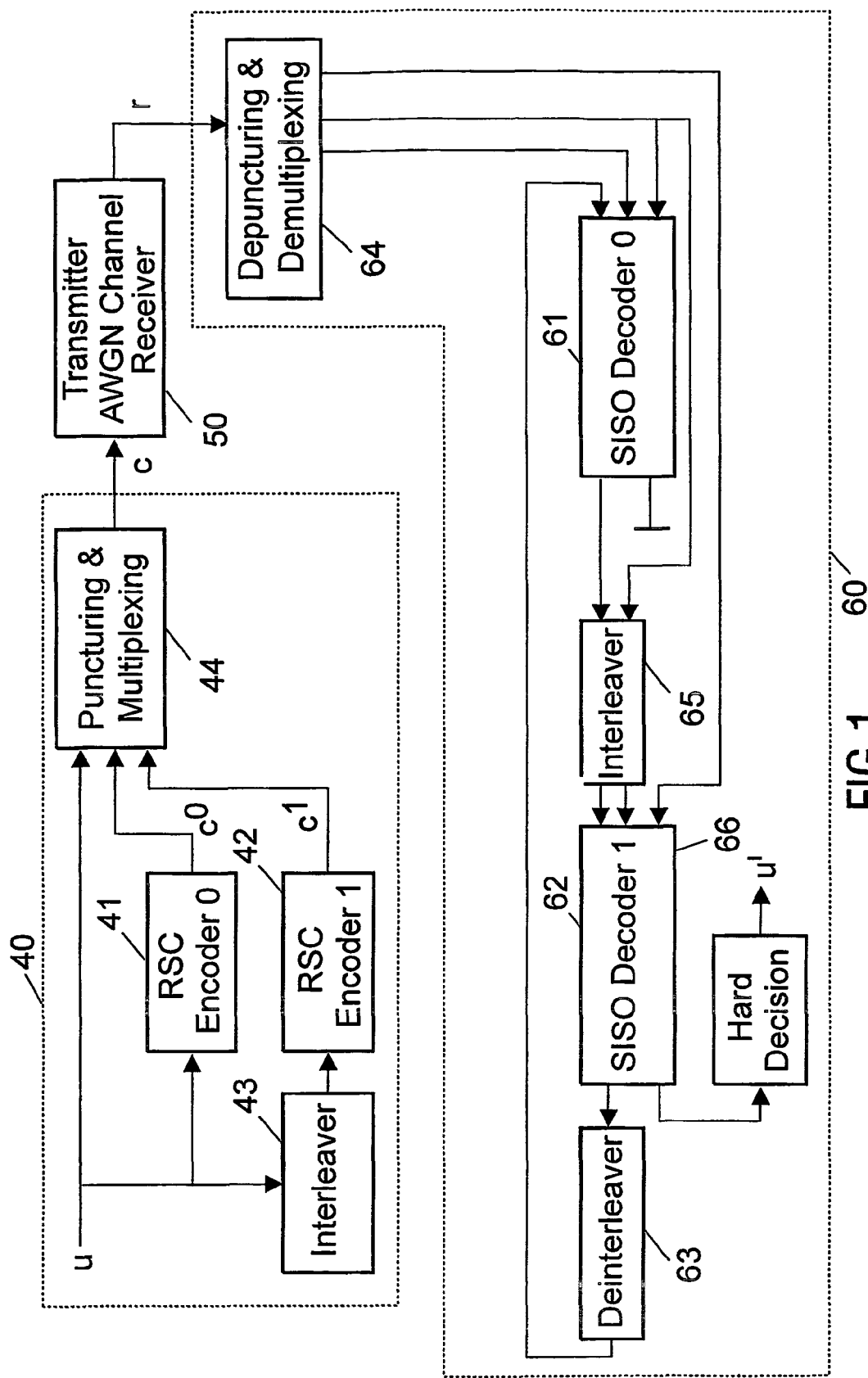
FIG. 1 shows a general layout of a known turbo encoder and a turbo decoder.

A block diagram of the general layout of a known turbo coding system including a turbo encoder and a turbo decoder is shown in FIG. 1. The turbo encoder 40 is implemented with two recursive, systematic convolutional (RSC) encoders 41, 42 in parallel concatenation. A frame of N information bits u is encoded by the first encoder 41, while an interleaver 43 creates a prespecified, random-like permutation of the information u, which is then encoded by the second encoder 42. The transmitted code sequence c, which is sent over the channel 50 consists of the information bits u along with the parity bits produced by the two encoders 41, 42. Puncturing, or periodic deletion, of the parity bits in a puncturing/multiplexing unit 44 is sometimes used to increase the overall code rate. The interleaver 43 endows the turbo code with structural properties similar to those of a random block code, which Shannon proved could, on average, achieve performance close to the information-theoretic limit with maximum-likelihood decoding.

However, the implementation of a maximum-likelihood (ML) sequence decoder for the turbo code would be prohibitively complex. Instead, a sub-optimal, but simple and effective, decoding architecture is often used. The decoder 60 incorporates separate soft-input, soft-output (SISO) decoders 61, 62 for each of the constituent convolutional codes, operating in an iterative and cooperative manner. Each constituent decoder 61, 62 generates soft outputs in the form of a posteriori probabilities (APP) for the received information bits. From these probabilities, a SISO decoder extracts "extrinsic information" values that are provided to the other SISO decoder as soft inputs that play the role of a priori probabilities for the information bits. At the start of the decoding, the noisy channel outputs corresponding to the information bits are used, after eventually being depunctured and demultiplexed by depuncturing/demultiplexing unit 64 to initialize the prior probabilities. They are also available to each constituent decoder 61, 62 throughout the decoding procedure. Between the SISO decoders 61, 62 a deinterleaver 63 and an interleaver 65 are provided. The number of repetitions of this cycle of decoding and exchange of the extrinsic information is dictated by a stopping rule, often a predetermined limit on the number of iterations. The turbo decoder output is a hard-quantized log-APP ratio of an information bit u produced by the final decoding cycle. More precisely, the a posteriori log-likelihood ratio (LLR) of an information bit $u_n$ at point in time n is expressed as $$LLR_n = \log((Pr(u_n=1|r)/Pr(u_n=0|r))$$

where r denotes the noisy channel output sequence. The final output sequence u' is obtained at the output of a hard decision unit 66.

Figure 2:
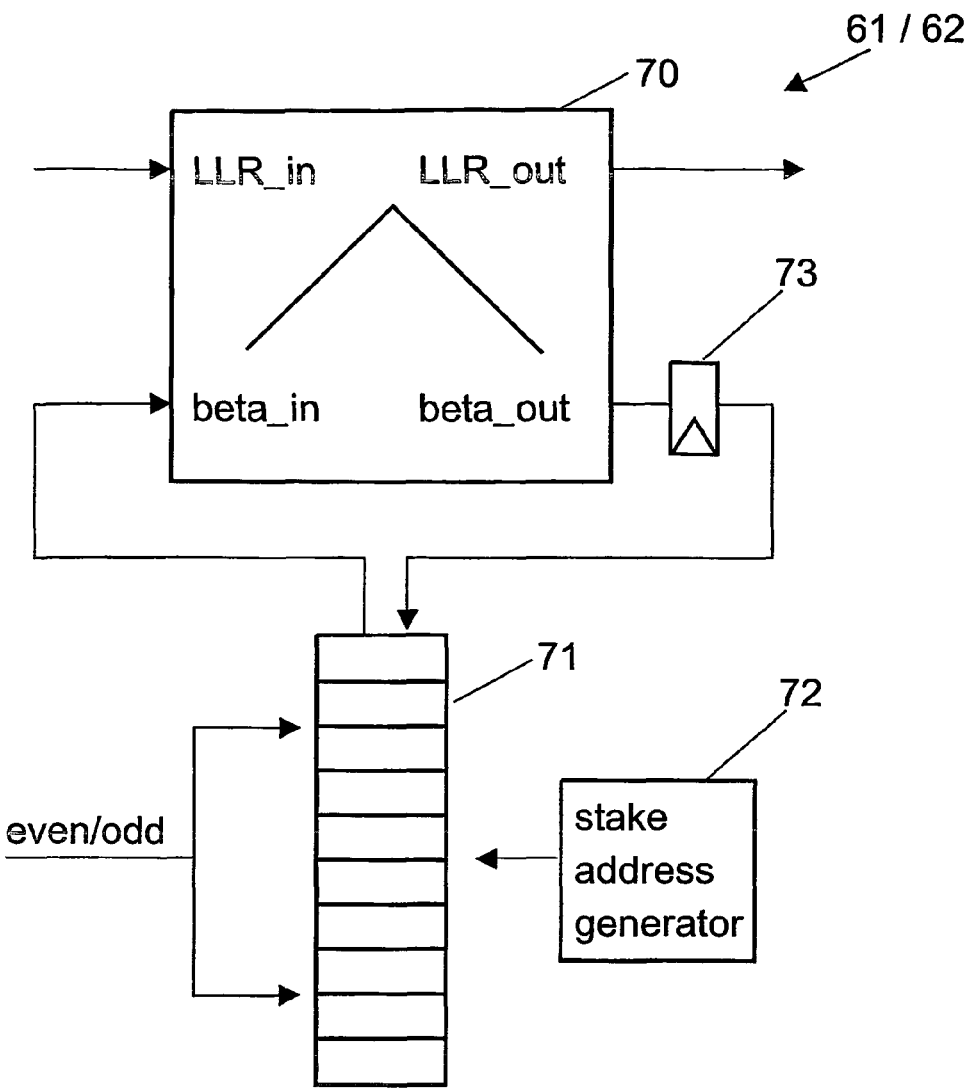
FIG. 2 shows a block diagram of a known SISO decoder.

A block diagram of a known SISO decoder 61, 62 as it is twice used in the turbo decoder shown in FIG. 1 is depicted in FIG. 2. Such a SISO decoder consists of at least one SISO decoding unit 70 that performs the SISO algorithm. In principle, this is the full block algorithm, however, this is positioned as a window of a bigger block, where the SISO decoding unit 70 typically serves a window size of 40.64 trellis sections. The beta-stakes, i.e. the backward state metrics β, of a window are initialized with the beta-stakes of the windows from the previous iteration which are stored in a stake memory 71. It should be noted that the stake memory 71 has two parts, one for the even, and one for the odd sub-iterations.

Figure 3:
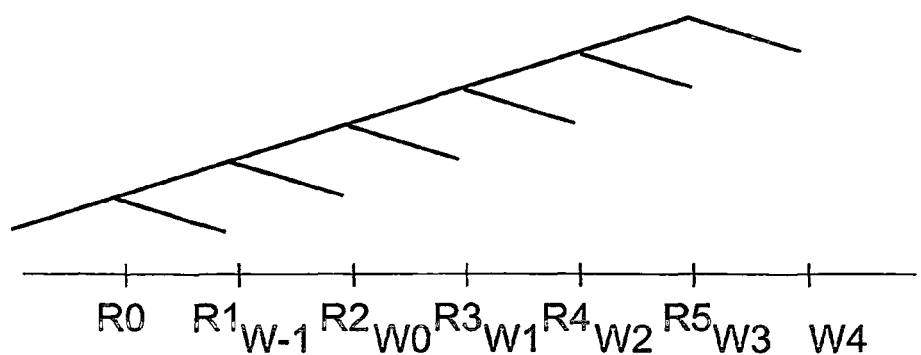
FIG. 3 shows a timing diagram illustrating SISO decoding using the known SISO decoder.

The read and write operations on the stake memory 71 are conducted by a stake address generator 72. This unit schedules the read and write operations which is trivial as is shown in FIG. 3, where the read (indicated by R) and write (indicated by W) operations are shown over time. It should be noted that write operation W-1 is shown only for clarity but it is dismissed in a real implementation. The figure also shows that the stake of the last window is only read but never produced. The last stake vector is considered as value that has to be initialized. Whereas in the figure all windows are of the same length, in a practical implementation the last window-length can be different. This does not influence the addresses that have to be generated, but only the timing of the last write operation. The beta-vectors which come out of the SISO decoding unit 70 are buffered by a buffer 73 to enable their write back when it is required (reads and writes can not be conducted simultaneously).

Figure 4:
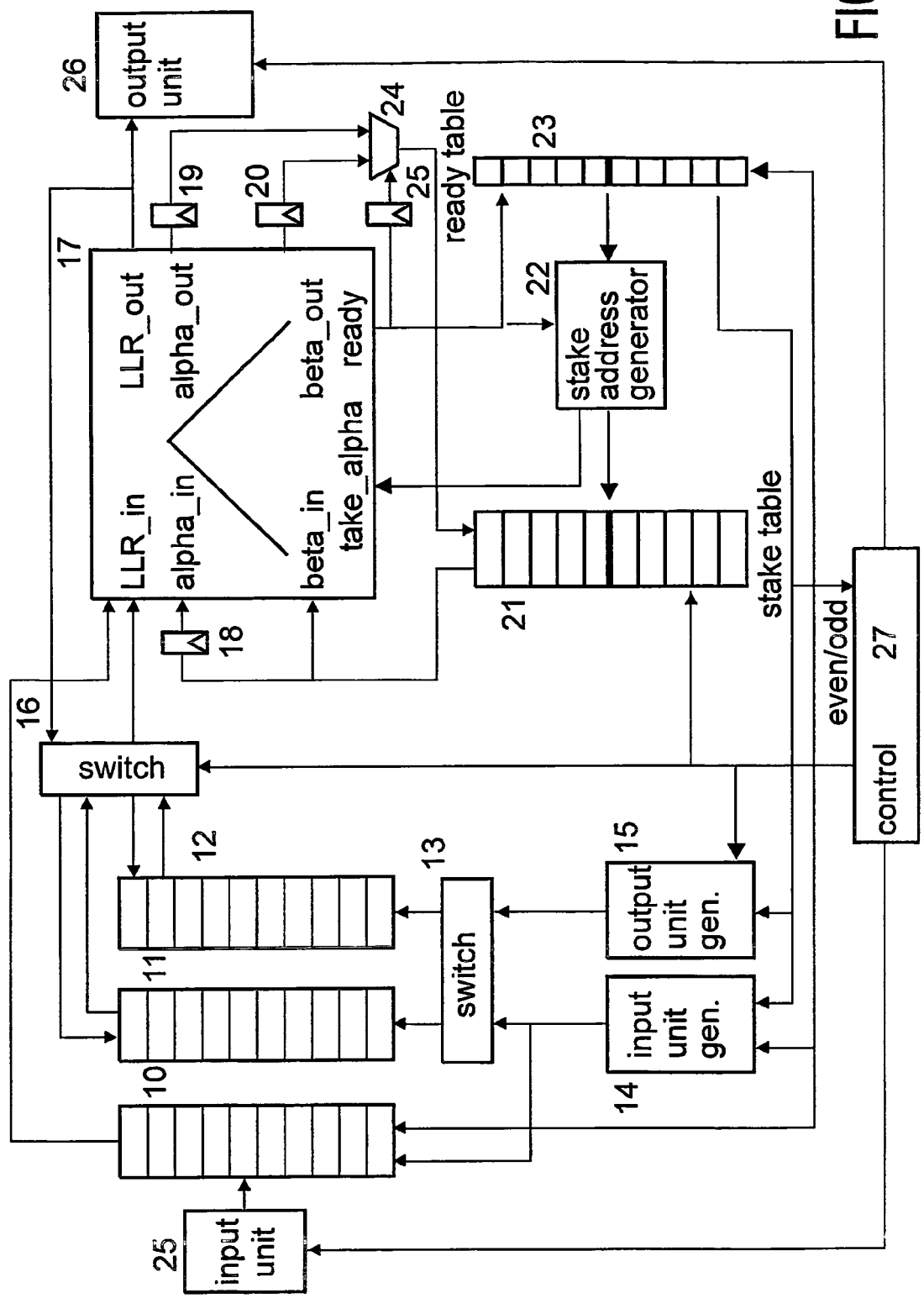
FIG. 4 shows a block diagram of a SISO decoder according to the invention.

FIG. 4 shows an detailed embodiment of a SISO decoder according to the present invention. For the implementation of the early detection of windows that do not have to be calculated again, the architecture has to be modified. Details of the elements contained in the SISO decoder according to the invention will be explained below.

The turbo decoder gets its inputs from a channel, which can in practice include a bit-detector or demodulator. Then the use of soft-decision bit-detectors or soft-decision demodulators is common and advantageous. The input values to the turbo decoder, i.e. the information symbols received by an input 25 from the external (often referred to as systematic, parity 1 and parity 2 data), are stored in an input memory 10. The received information symbols are the input data for the SISO algorithm. The even/odd input is used to pass out parity 1 data in even and parity 2 data in odd sub-iterations. In extrinsic memories 11, 12 the data that go from one iteration to another are saved. This is the so-called extrinsic information, i.e. information that is learned during the iterations. The extrinsic memories 11, 12 are swapped during each iteration by means of switches 13, 16. An input address generator 14 takes care of address generation depending on even/odd iteration (even means interleaving) and on a ready table 23, since addresses for windows that are ready do not have to be generated. An output address generator 15 takes care of address generation depending on even/odd iteration and on the ready table 23.

The SISO decoding unit 17 processes the input data of a window. If a window is ready it signals this by means of a ready flag (or a window activity flag which is set to inactive). Buffers (in particular flip-flops) 18, 19, 20, 25 are used to decouple the timing of the SISO decoding unit 17 with the read/write back to the stake memory 21, which is different for even/odd iterations. This stake memory saves the alpha or beta stakes and is fully under control of the stake address generator 22 which generates the write addresses depending on the ready flag (window activity flag) of the processed window and the read addresses, depending on the to-process windows, by means of the ready table 23. In the ready table 23 the information of the completeness of each window is stored, for instance, for each window the state of the corresponding ready flag (or window activity flag) is stored. It should be noted that it is different for even/odd iterations. A multiplexer 24 is used to store either the alpha or beta stake, depending on the next/new activity state of that window.

An output unit 26 takes the outputs (decisions) of the SISO decoding unit 17 and passes them to extern. A control unit 27 controls the decoder, in particular the iterations. First, all inputs are taken from the input unit 25, then the iterations (even/odd/even/ . . . ) are done, until e.g. all windows of an/both iteration(s) are correct or another stop criterion is met. Then the output unit 26 outputs the final LLR ratios as a posteriori soft-information.

If a SISO window signals that a window is ready, the alpha stake (i.e. the forward state metrics α) is saved instead of the beta stake. This alpha stake can be saved at the position where previously the beta stake of its own window was saved: the beta stake is not needed anymore, because the window is never calculated anymore. It should be noted that this is not the same address, because normally the beta stake for the previous window is written. The alpha stake needs to be saved, because it is not recalculated anymore. It should be noted that for windows that follow a skipped window, both the alpha and beta stake have to be retrieved from the stake memory.

Figure 5:
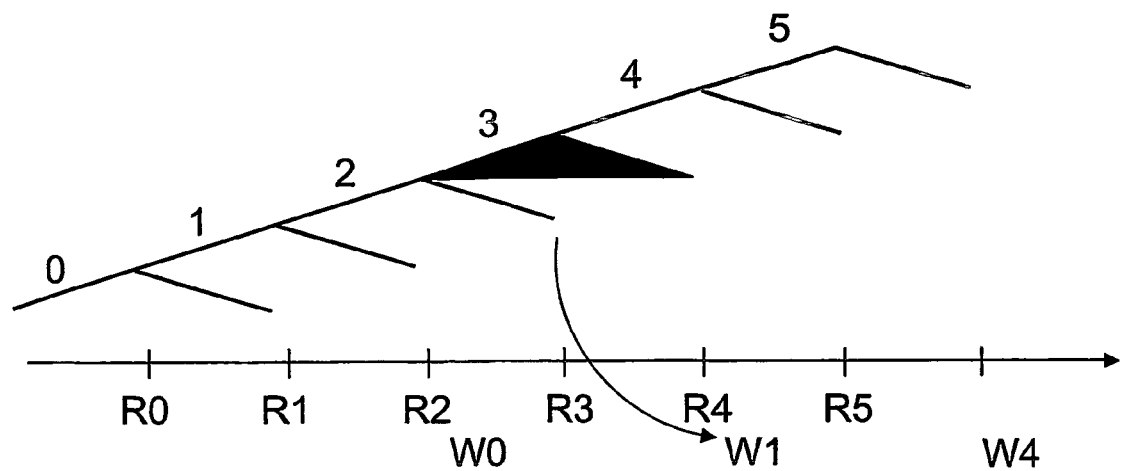
FIG. 5 shows a timing diagram illustrating SISO decoding using the SISO decoder according to the invention.
Figure 5:
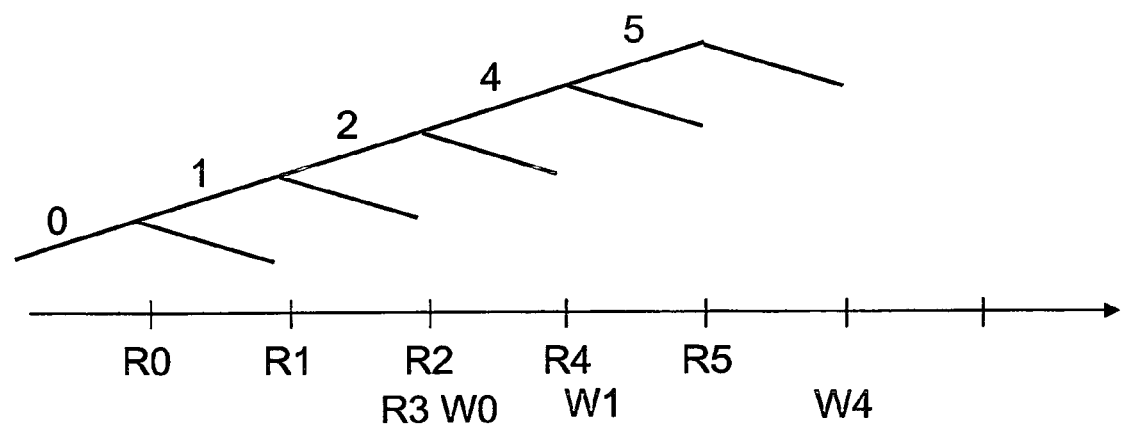

One significant change in the implementation is in the stake address generator 22. During the first iteration, its timing behavior is equal to the previous implementation, shown in FIG. 2. However, for future iterations, the timing changes as shown in FIG. 5, which shows the timing behavior in two steps. During a previous iteration, window 3 (indicated on the diagonal line) was considered ready. This implies that for window 4 an alpha stake has to be retrieved, which is stored in the position 3. The second implication is that after window 4 is processed, it may not produce the beta vector for the previous window. This would overwrite the alpha vector stored there. If, however, this window is ready, the alpha vector has to be saved (at position 4).

The stake address generator 22 has to calculate how many windows have to be skipped, which is a fairly simple operation, especially because it might take more cycles. Until now, only the implications for the SISO decoding unit have been described. However, also at top-level some changes may be required. One example can be found in the address generation for the LLRs: the addresses of the blocks that are skipped are not generated. It is to be noted that, because they are not generated, they are not overwritten and their old value can be used in the next half iteration. Only the LLRs of the processed windows are updated.

It has been found that by use of early detection of windows with window based SISO decoders into a per-window stopping rule, as proposed according to the invention, the power consumption of a known turbo decoder could be reduced by around 35% more than with the well-known cross entropy stopping rule described by Hagenauer et al. in "Iterative Decoding of Binary Block and Convolutional Codes", IEEE Transactions on Information Theory, Vol. 42, No. 2, March 1996, with around the same BER or FER performance in the waterfall region. The latter stopping rule is a global stopping rule. In general, the reduction is dependent on the Eb/No of the transmission channel. The higher the Eb/No, the smaller the computational load. This is true for all stopping criteria. For the high SNR per-window stopping rules, with frame length 1296, there appears to be virtually no loss in BER or FER performance w.r.t. the case without stopping rules. This is also the reason why once the low SNR per-window stopping rule is used, adding the high SNR per-window stopping rule leaves the BER and FER curves virtually unchanged. The low SNR per-window stopping rule does give some degradation.

Using e.g. a global (per-block) stopping criterion based on cross entropy for the maximum block length of 5114, the average number of iterations can be reduced from e.g. at 1.0 dB Eb/No from 8 to ca. 4.9. When the per-window stopping criterion as herewith proposed is used, the average effective number of iterations can be reduced to ca. 3.2. Here, the addition of the word "effective" accounts for the fact that an iteration during which only half of all windows are active has a weight of 0.5 in the effective workload. This constitutes a savings of around 35 percent. Using a memory reuse technique, when using "single stakes" as in a known turbo decoder implementation, per-window stopping criteria need not increase the memory requirement of the chip. In general, the savings in the computational load with respect to the situation without stopping rule are larger for larger signal to noise ratios on the channel.

Contrary to the SISO decoder known from the above mentioned publication of Frey and Kschischang, according to the present invention it is only required to detect whether the absolute values of all log-likelihood ratios in a sliding window have become larger than some constant to detect that a window should be frozen. Once a window is frozen, processing for that window is completely omitted. That is, then there is no reorganization overhead later on. Only a simple activity flag is required to mark a window as active or frozen. The fact that the partitioning of a (direct or permuted) turbo codeword into (sliding) windows is very structured, i.e. uses fixed (non-random) window lengths, with a regular distance between starting points of windows makes it that the need for flexibility in processing as the known SISO decoder needs it can be avoided.

In FIG. 5 of the publication of Frey and Kschischang an implementation of a 2-state trellis is shown. Many turbo codes (e.g. the UMTS turbo code) use 8-state trellises. The larger the number of states in a trellis, the more complex the reorganization of the computations when bits or series of bits become certain will be. This complexity will cost resources (chip area, current, processing time) in a hardware implementation.

Since according to the invention non-random starting and stopping positions for the series of bits that are frozen are used, flexibility in the processing is not needed, and thus the advantages of the invention carry through in a hardware implementation. There are savings in hardware computation time, (therefore) savings in battery power consumption of an handset employing a turbo decoder.

The advantages of the invention carry through likewise for MAP, MaxLogMAP or Max*LogMAP; they also apply to multiplication- or logarithm-free algorithms. Just the output a posteriori (alternatively: extrinsic) log-likelihood ratios are just kept in memory "as is" without further processing. This always saves processing time, and therefore, current.

In summary, the known trellis splicing has the following disadvantages.

Trellis splicing needs an amount of flexibility in which computations are to be performed which depends bit-wise on the random noise and random distortions in the received signal that are difficult to realize in hardware, which will undermine advantages of this method when implemented in hardware.

The advantages of the algorithm of Frey and Kschischang will be further undermined for multiplication- or logarithm-free algorithms such as the Max(*)LogMAP algorithm.

When the number of states in the trellis becomes larger than 2, the reorganization overhead of the computations in Kschischang's algorithm grows.

The present invention applies both to sliding window turbo decoders with and without training phase. Such a training phase amounts to a small overlap between windows. This is an alternative technique to next iteration initialization, which is used by different embodiments of turbo decoders as, for instance used, in mobile communication.

The invention claimed is:

1. SISO decoder for iteratively decoding a block of received information symbols (r), in particular for use in a turbo decoder, said block being divided into a number of windows of information symbols, said SISO decoder comprising:
  at least one SISO decoding unit (17, 21) for SISO decoding of the received information symbols (r) of a window,
  a window activity flag storage (23) for storing window activity flags indicating if a window is made active or inactive,
  a window activity flag setting unit (17) for setting said window activity flag active or inactive, wherein said window activity flags are initially set active and wherein a window activity flag of a window is set inactive if a certitude indication value of the information symbols in said window are above a predetermined certitude threshold,
  a window activity flag reading unit (17, 22) for reading said window activity flags from said window activity flag storage (23), and
  a control unit (27) for controlling said at least one SISO decoding unit (17) based on the read window activity flags such that the information symbols of a window for, which the corresponding window activity flag is set inactive are not SISO decoded in subsequent iterations.

2. SISO decoder as claimed in claim 1, wherein said certitude indication value is the absolute values of the log-likelihood ratios of the information symbols and wherein a window activity flag of a window is set inactive if the absolute values of the log-likelihood ratios of the information symbols in said window are above a predetermined log-likelihood threshold.

3. SISO decoder as claimed in claim 1, wherein a SISO decoding unit (17, 21) comprises:
  a forward processing unit for computing forward state metrics ($\alpha$),
  a backward processing unit for computing backward state metrics ($\beta$),
  metrics storage means (21) for storing forward and backward state metrics ($\alpha$, $\beta$),
  P output means (LLR_out, alpha_out, beta_out) for outputting forward and/or backward state metrics ($\alpha$, $\beta$), and
  input means (LLR_in, alpha_in, beta_in) for receiving forward state metrics from a SISO decoding unit that decodes channels symbols of a window being located in front of the currently processed window and for receiving backward state metrics from a SISO decoding unit that decodes channels symbols of a window being located behind the currently processed window.

4. SISO decoder as claimed in claim 3, wherein said metrics storage means (21) are adapted for storage of the starting state metrics for forward and/or backward calculations ($\alpha$, $\beta$) of a window.

5. SISO decoder as claimed in claim 1, comprising a plurality of SISO decoding units (17) for parallel SISO decoding of the information symbols of a plurality of windows.

6. SISO decoder as claimed in claim 1, comprising a single SISO decoding unit (17) for serial SISO decoding of the information symbols of a plurality of windows.

7. SISO decoder as claimed in claim 1, wherein said control unit (27) is adapted for controlling the iterative SISO decoding of the information symbols of the channel data stream such that the iteration is stopped after a predetermined number of iterations or if all windows are made inactive.

8. Turbo decoder for iteratively decoding received information symbols, in particular channel symbols of a channel data stream, comprising two SISO decoders (61, 62) as claimed in claim 1 for SISO decoding of said received information symbols, said SISO decoders (61, 62) being arranged in row, each having as inputs the received information symbols and a priori information probabilities of the information symbols generated as output by the respective other SISO decoder (61, 62).

9. SISO decoding method for iteratively decoding a block of received information symbols (r), in particular for use in a turbo decoder, said block being divided into a number of windows of information symbols, said SISO decoding method comprising the steps of:

SISO decoding of the received information symbols of a window, setting a window activity flag active or inactive, which window activity flag indicate if a window is made active or inactive and which are initially set active, wherein a window activity flag of a window is set inactive if a certitude indication value of the information symbols in said window are above a predetermined certitude threshold, storing said window activity flag, reading a window activity flag of an associated window that shall be SISO decoded next, and controlling said SISO decoding based on the read window activity flags such that the information symbols of a window for which the corresponding window activity flag is set inactive are not SISO decoded in subsequent iterations.

10. Turbo decoding method for iteratively decoding information symbols, in particular channel symbols of a channel data stream, comprising the steps of SISO decoding method performed in two SISO decoders (61, 62) as claimed in claim 1 for SISO decoding of said information symbols, said SISO decoders being arranged in row, each having as inputs the information symbols and a priori information probabilities of the information symbols generated as output by the respective other SISO decoder.

11. A computer comprising a computer program code to perform the steps of the method of claim 9.

\* \* \* \* \*